(12) United States Patent
Bleidistel et al.

(10) Patent No.: US 8,269,948 B2
(45) Date of Patent: Sep. 18, 2012

(54) PROJECTION EXPOSURE APPARATUS AND OPTICAL SYSTEM

(75) Inventors: Sascha Bleidistel, Aalen (DE); Bernhard Geuppert, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 744 days.

(21) Appl. No.: 12/390,685

(22) Filed: Feb. 23, 2009

(65) Prior Publication Data

US 2009/0225297 A1  Sep. 10, 2009

Related U.S. Application Data

(63) Continuation of application No. PCT/EP2007/007448, filed on Aug. 24, 2007.

(60) Provisional application No. 60/823,543, filed on Aug. 25, 2006.

(30) Foreign Application Priority Data

Aug. 25, 2006 (DE) .......................... 10 2006 039 821

(51) Int. Cl.
*G03B 27/54* (2006.01)
*G03B 27/52* (2006.01)

(52) U.S. Cl. ........................................... 355/67; 355/55

(58) Field of Classification Search ........... 355/55
See application file for complete search history.

(56) References Cited

U.S. PATENT DOCUMENTS

| | | |
|---|---|---|
| 2,822,133 A | 2/1958 | Grayson et al. |
| 4,947,077 A | 8/1990 | Murata |
| 5,027,027 A | 6/1991 | Orbach et al. |
| 5,027,028 A | 6/1991 | Skipper |
| 5,068,566 A | 11/1991 | Culp |
| 5,092,360 A | 3/1992 | Watanabe et al. |
| 5,136,201 A | 8/1992 | Culp |
| 5,939,816 A | 8/1999 | Culp |
| 6,066,911 A | 5/2000 | Lindemann et al. |
| 6,150,750 A | 11/2000 | Burov et al. |
| 6,211,605 B1 | 4/2001 | Burov et al. |
| 6,487,045 B1 | 11/2002 | Yanagisawa |
| 6,800,984 B2 | 10/2004 | Marth |
| 2003/0085633 A1 | 5/2003 | Marth |

(Continued)

FOREIGN PATENT DOCUMENTS

DE  40 36 287  5/1991

(Continued)

OTHER PUBLICATIONS

Y. Egashira et al., "Sub-Nanometer Resolution Ultrasonic Motor for 300mm Wafer Lithography Precision Stage," Japanese J. Appl. Phys., vol. 4 (2002), pp. 5858-5863.

(Continued)

*Primary Examiner* — Toan Ton
*Assistant Examiner* — Michelle Iacoletti
(74) *Attorney, Agent, or Firm* — Fish & Richardson P.C.

(57) ABSTRACT

The disclosure relates to a projection exposure apparatus and an optical system, such as a projection objective or an illumination system in a projection exposure apparatus for microlithography, that includes at least one optical element and at least one manipulator having a drive device for the optical element. The drive device can have at least one movable partial element and at least one stationary partial element movable relative to one another in at least one direction of movement.

38 Claims, 7 Drawing Sheets

U.S. PATENT DOCUMENTS

2004/0263812 A1* 12/2004 Hummel et al. ............... 355/53
2006/0164619 A1* 7/2006 Back et al. ................... 355/67

FOREIGN PATENT DOCUMENTS

| DE | 19 605 214 | 8/1996 |
| DE | 19 715 226 | 10/1998 |
| DE | 199 01 295 | 7/2000 |
| DE | 199 10 947 | 9/2000 |
| DE | 102 25 266 | 7/2003 |
| DE | 103 01 818 | 7/2004 |
| DE | 103 44 178 | 4/2005 |
| EP | 0 633 616 | 1/1995 |
| EP | 1 548 855 | 6/2005 |
| JP | 63-316675 | 12/1988 |
| JP | 4-212913 | 8/1992 |
| WO | WO 97/47072 | 12/1997 |

OTHER PUBLICATIONS http://content.semi.org/cms/groups/public/documents/events/p035937.pdf.

* cited by examiner

PROJECTION EXPOSURE APPARATUS AND OPTICAL SYSTEM

CROSS-REFERENCE TO RELATED APPLICATIONS

This application is a continuation of, and claims benefit under 35 USC 120 to, international application PCT/EP2007/007448, filed Aug. 24, 2007, which claims benefit of German Application No. 10 2006 039 821.1, filed Aug. 25, 2006 and U.S. Ser. No. 60/823,543, filed Aug. 25, 2006. International application PCT/EP2007/007448 is hereby incorporated by reference in its entirety.

FIELD

The disclosure relates to a projection exposure apparatus and an optical system, such as a projection objective or an illumination system in a projection exposure apparatus for microlithography, that includes at least one optical element and at least one manipulator having a drive device for the optical element. The drive device can have at least one movable partial element and at least one stationary partial element movable relative to one another in at least one direction of movement.

BACKGROUND

Optical systems, such as those used a projection objective or an illumination system in a projection exposure apparatus for microlithography, are known. In some optical systems, a drive device, operated with piezoelectric elements can be used to help achieve desired imaging accuracy by active positioning of optical elements correspondingly provided with a drive device. In some instances, image aberrations can be addressed in this way. In certain cases, an arrangement of piezoelectric elements have been combined to form stacks, where one part of the piezoelectric elements has its direction of action perpendicular to the direction of movement and a second part has its direction of action parallel to the direction of movement.

SUMMARY

The present disclosure provides an optical system such as a projection objective or an illumination system in a projection exposure apparatus for microlithography, having a manipulator having a linear drive with piezoelectric elements. Optionally, the piezoelectric elements can be used to move an optical element in multiple degrees of freedom and over relatively large travel distances.

In some embodiments, the disclosure provides a projection exposure apparatus, such as for microlithography, including optical elements and at least one manipulator having a drive device for at least one optical element.

In certain embodiments, the disclosure provides a method using an exposure apparatus.

Some embodiments involve precisely three drive devices acting on the circumference of the optical element in such a way that displacements in six degrees of freedom become possible.

The displacement or movement possibilities for an optical element to be manipulated can be increased by the division of the piezoelectric elements in three directions of action. Thus, alongside displacements in the direction of the Z-axis and tiltings relative to the Z-axis, movements in a plane perpendicular to the Z-axis are also possible. In this way, alongside Z-displacements, displacements of the optical element that are orthogonal with respect thereto are now also possible.

Relatively large travel distances also become possible with piezoelectric elements that are advantageous.

In certain embodiments, such as when the angle lies at least approximately at a right angle with respect to the direction of movement or of action of the second part of piezoelectric elements, an optical element to be manipulated can be moved very precisely (e.g., in the X-/Y-plane).

In certain embodiments, sufficiently stable and precise movement can be achieved by providing at least three stacks of piezoelectric elements which are arranged at a distance from one another.

In some embodiments, an analog movement during guidance of the movable part can be achieved if at least three stacks of piezoelectric elements are arranged at a distance from one another.

In certain embodiments, a reliable step-by-step movement of the movable partial element can be achieved when at least six stacks of piezoelectric elements which are arranged at a distance from one another are provided. In such embodiments, each stack can be provided with a corresponding number of piezoelectric elements, wherein each stack is composed of three elements arranged in differently oriented fashion and thus permits all three directions of action.

Optionally, each stack piezoelectric elements can be activated only in one or only in two directions of action. In such instances, piezoelectric elements of the different stacks can be activated in a coordinated manner by corresponding driving.

In some embodiments, the movable partial element is between two stationary partial elements arranged opposite one another. Such an arrangement can help allow for relatively precise guidance and relatively exact movement.

In certain embodiments, precisely three drive devices are distributed uniformly over the circumference of the optical element. The three drive devices include stacks of piezoelectric elements as direct drives which can be activated independently of one another. Such an arrangement can achieve not only the three translational degrees of freedom but also in addition three rotational degrees of freedom, that is to say in total therefore six degrees of freedom. This means that tiltings or rotations in each case about the X-/Y- or Z-axis additionally become possible as well. To achieve this, each of the three drive devices can be arranged in a manner distributed over the circumference is provided with at least in each case three stacks of piezoelectric elements which are then activated correspondingly differently for tiltings or rotations.

One of the main areas of use of the optical system is projection exposure apparatuses for microlithography and in this context projection objectives or illumination devices, since accuracies in the nanometers range are desired in this case.

However, the disclosure is also suitable, in principle, as an adjusting device of a general type for a wide variety of elements to be adjusted. This holds true, for example, for the cases where an adjustment is intended to be effected with extremely high precision and with relatively large distances, such as, for example, measuring and testing equipment in a wide variety of technical fields.

One of the essential advantages is that the piezoelectric elements, given corresponding driving, can implement step-by-step travel distances and thus practically a "crawling" of the part to be moved (e.g., an optical element) over a relatively long distance.

BRIEF DESCRIPTION OF THE DRAWINGS

Various embodiments and advantages will become apparent from the disclosure in conjunction with the figures, in which.

DETAILED DESCRIPTION

Figure 1:
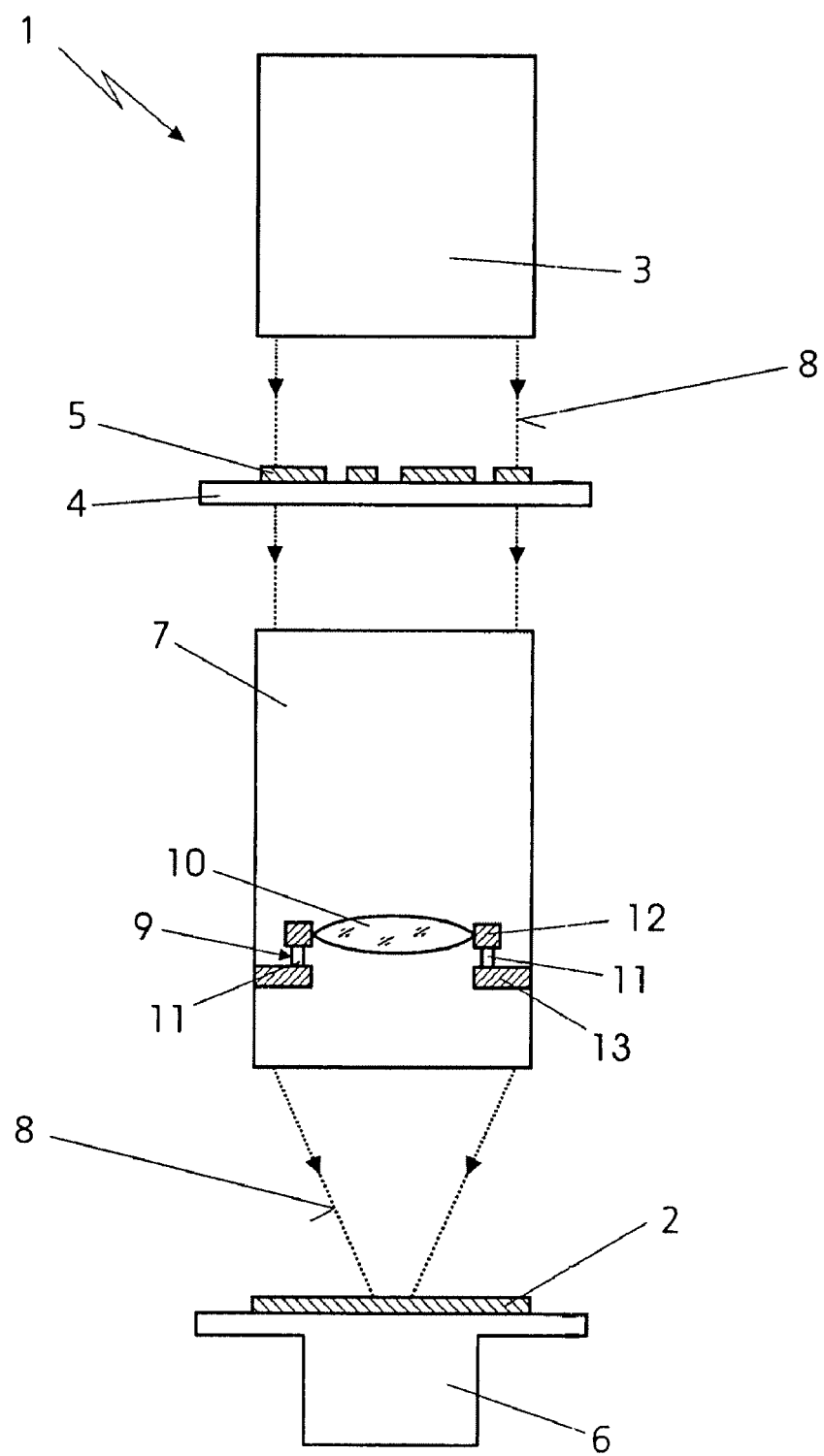
FIG. 1 shows a basic illustration of a projection exposure apparatus for microlithography.

A projection exposure apparatus is illustrated in principle in FIG. 1 (e.g., for microlithography for the production of semiconductor elements). Many general aspects of such an apparatus are known and are disclosed, for example, in DE 102,25,266 A1.

The projection exposure apparatus 1 has an illumination device 3, a device 4 for receiving and exactly positioning a mask provided with a grating-like structure, a so-called reticle 5, which determines the later structures on a wafer 2, a device 6 for retaining, moving and exactly positioning the wafer 2, and an imaging device in the form of a projection objective 7.

Since the structures introduced into the reticle 5 are exposed on the wafer 2 in demagnified fashion, in general, very stringent properties are desired with regard to resolution and precision are made of the imaging device 7, namely the projection objective. Typically, the range of a few nanometers is involved.

The illumination device 3 provides a projection beam 8 for the imaging of the reticle 5 on the wafer 2. A laser can be used as a source of the radiation. An image of the reticle 5 is generated by the projection beam 8 and is demagnified by the projection objective 7 and subsequently transferred to the wafer 2.

A multiplicity of transmissive and/or refractive and/or diffractive optical elements such as, for example, lenses, mirrors, prisms, terminating plates and the like are arranged in the projection objective 7.

One or more optical elements arranged in the projection objective 7 are provided with one or more manipulators 9. A manipulator 9 is schematically illustrated in FIG. 1 together with a lens 10 to be manipulated.

The manipulator 9 includes a linear drive as drive device 11, by which a movable partial element 12 fixedly connected to the optical element 10, for example the mount of the lens 10, can be moved relative to a partial element 13 fixedly connected to the projection objective 7. The partial element 13 can be for example an outer mount or a part of the objective housing.

Figure 2:
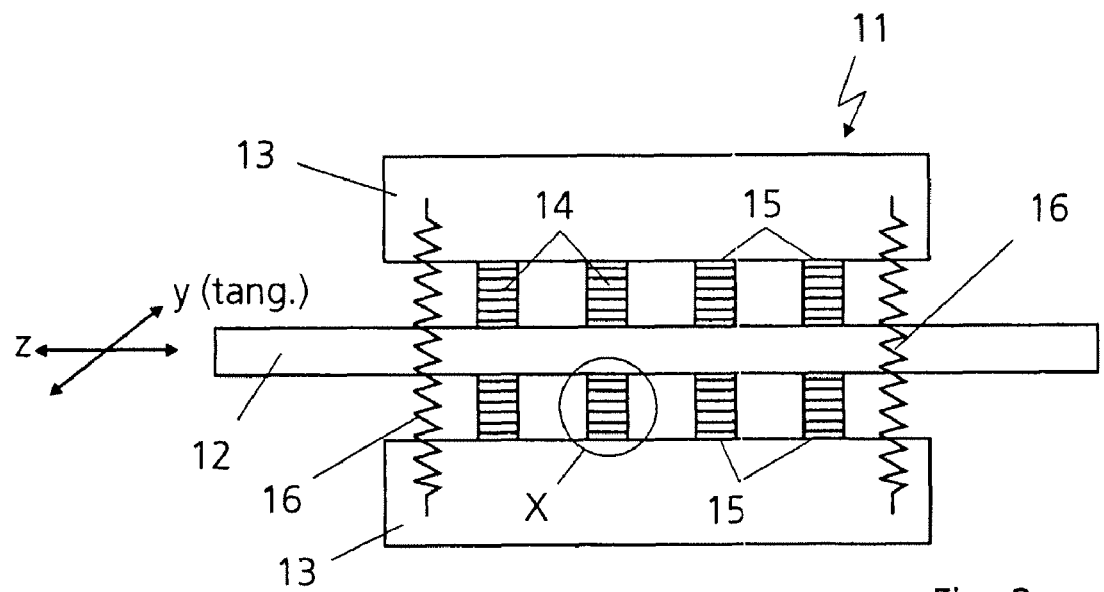
FIG. 2 shows a basic illustration of a linear drive with piezoelectric elements.
Figure 3:
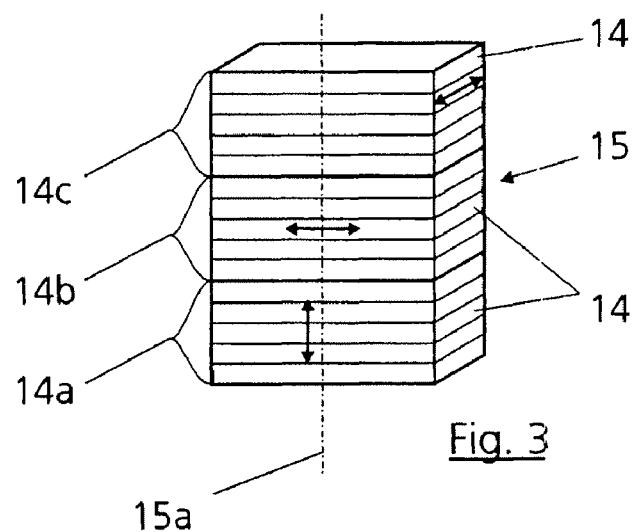
FIG. 3 shows an enlarged illustration of a stack with piezoelectric elements from FIG. 2 in accordance with excerpt enlargement X.
Figure 4:
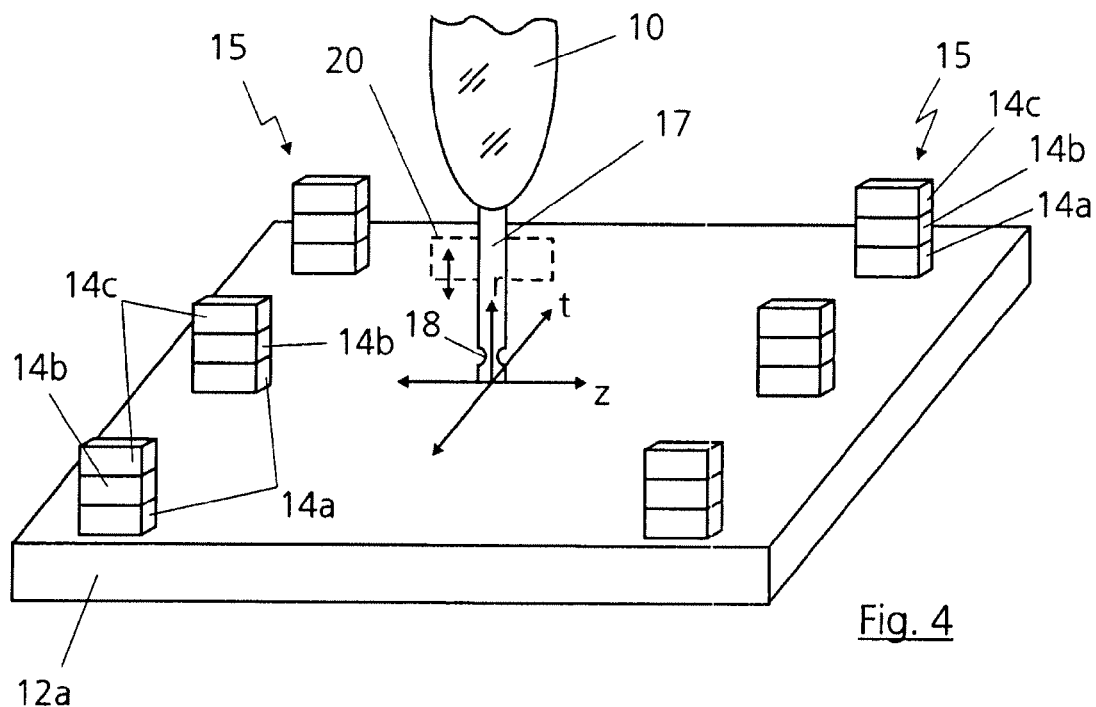
FIG. 4 shows a three-dimensional illustration of a movable partial element with 6 piezo-stacks.

The drive device 11, which is illustrated only schematically in FIG. 1, is illustrated in detail in FIGS. 2 to 4. As can be seen, the movable partial element 12 is arranged between two stationary partial elements 13 lying opposite one another. Between the movable partial element 12 and the two stationary partial elements 13, which can also be embodied in one piece, four stacks 15, including piezoelectric elements 14 which are arranged on each side are situated in a manner lying opposite one another. The stacks 15 are arranged at a distance from one another and, for a precise guidance or displacement of the movable partial element 12, should as far as possible also be arranged precisely opposite one another on the different sides. As can be seen, "crawling movements" of the partial element 12 are thus possible in a plane, e.g. in the X- or Z-direction and perpendicular thereto in the Y- or tangential direction.

The construction of a stack 15 including piezoelectric elements 14 can be seen on an enlarged scale from FIG. 3. As can be seen, the stack 15 includes three parts 14a, 14b, 14c of piezoelectric elements 14, wherein e.g. stack 14a acts as stroke elements, 14b as shear elements and 14c as shear elements in a direction directed orthogonally with respect to the stack 14b. Via the piezoelectric elements 14a in the stack, the stacks 15 lying alongside one another can then be moved, given corresponding activation, in such a way that during a stroke, a clamping of the partial element 12 can be effected and, upon release of the clamping, a first crawling step can be effected by activation of the stacks 14b and/or 14c.

The drive device 11 can be positioned in the projection objective 7 for example in such a way that the Z-axis as optical axis runs parallel to the longitudinal axis of the partial element 12, e.g. of a lens. The optical axis is therefore also the axis of the system. Displacements of the lens 10 are thus possible in the direction of the optical axis and in a direction perpendicular thereto, e.g. in a tangential direction, given corresponding arrangement of the drive devices 11 with the piezoelectric stacks 15.

Thus, by way of example, the second part 14b of the piezoelectric elements 14 in the Z-direction and the third part 14c of the piezoelectric elements 14 in the tangential direction can in each case have its plane of action with a corresponding shearing. The part 14a of the piezoelectric elements which is responsible for a stroke in this case moves in a radial direction or clamps the partial element 12 or releases it for a movement of the partial element 12 cyclically.

More detailed explanations concerning the mode of action and the movement of the movable partial element 12 are given below with references to FIGS. 4 to 11.

It can be seen from the enlarged illustration in FIG. 3 that the first part 14a of piezoelectric elements 14 is provided with a direction of action upon the activation of the elements which runs in the direction of the longitudinal axis 15a of the stack 15 and thus clamps or releases the movable partial element 12. The second part 14b of the piezoelectric elements 14 has, with a shear movement, a direction of action parallel to a predetermined direction of movement of the movable partial element 12. A third part 14c of the piezoelectric elements 14 is likewise provided, in a shear movement, with a direction of action which lies at right angles with respect to the direction of movement of the second part 14b of the piezoelectric elements 14.

The embodiment of the piezoelectric elements 14 arranged in stackwise fashion in respectively three parts having different directions of action results in a possibility of movement for the movable partial element 12 in two degrees of freedom.

FIG. 4 shows a configuration with a plate-type rotor as movable partial element 12a.

If in each case six stacks 15 are arranged above and below the plate-type rotor (the stacks below and the stationary partial element 13 are not illustrated), then a movement of the movable partial element is possible both in analog fashion and in the step mode. At least six stacks per side should be present in order that in each case three stacks can lift off for a step, while the other stacks can move and guide the movable partial element reliably in the displacement plane. If such precise guidance is not necessary or if guidance is effected in some other way, it is also possible, if appropriate, to provide fewer stacks of piezoelectric elements on each side.

In the case of the configuration with in each case four stacks of piezoelectric elements 14 above and below, the movement for the plane during a step would have to be maintained by two stacks in each case.

A simplified configuration may consist in arranging in each case three stacks above and three stacks below the movable partial element. In this case, however, a prestress of the movable partial element 12 is involved and the movable part 12 can also only be moved in analog fashion. A prestress can be achieved for example by one or more spring devices 16, as illustrated in FIG. 2. As can be seen, the movable partial element 12 is in this case clamped between the two stationary partial elements 13 lying opposite one another, in order to obtain reliable positioning.

FIGS. 5a to 5f illustrate the possibilities of movement of the movable partial element 12 in different stages with four stacks 15.

Figure 5A:
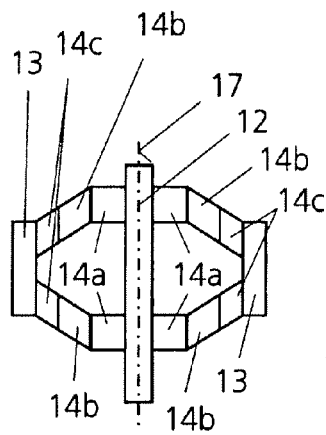
FIGS. 5a to 5f show various illustrations of movement stages of a movable partial element.

FIG. 5a shows the starting point, wherein the partial element 12 is in each case fixedly clamped by the part 14a of the piezoelectric elements that exert a stroke as direction of action upon activation.

Figure 5B:
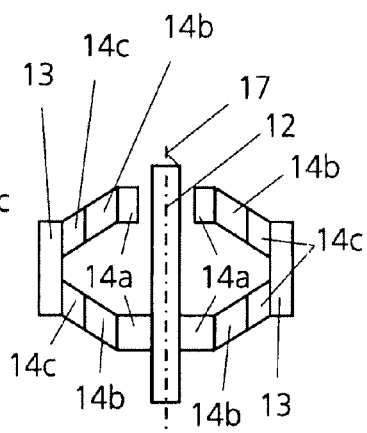

FIG. 5b illustrates the subsequent step in the movement sequence, wherein two parts 14a with the "stroke piezos" are open and thus no longer in engagement with the movable part 12. The two stroke piezos 14a still effecting clamping fixedly hold the movable partial element 12 and can initiate a movement upon activation of the part 14b of the piezoelectric elements that act as "shear piezos".

Figure 5C:
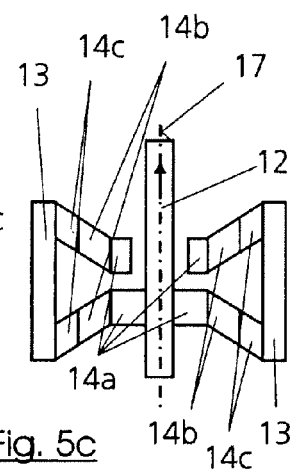

This step can be seen from FIG. 5c.

Figure 5D:
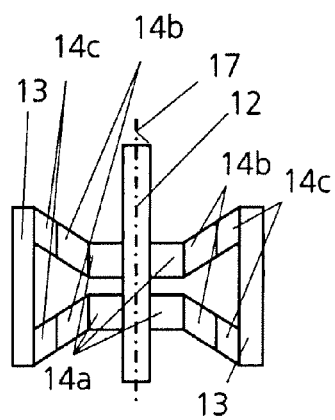

FIG. 5d shows the next step in the movement sequence, wherein the "stroke piezos" of the parts 14a clamp the partial element 12 again.

Figure 5E:
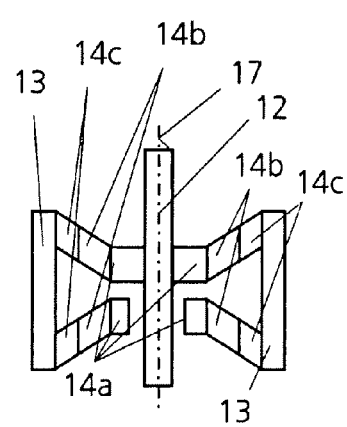
Figure 5F:
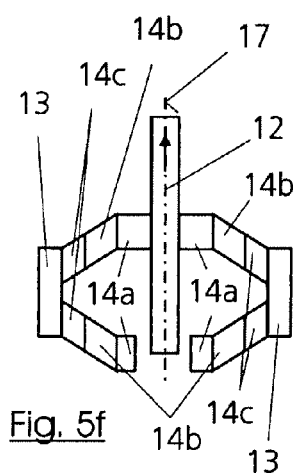

FIG. 5e shows, similarly to FIG. 5b, how the clamping of the other two stroke piezos of the parts 14a is released, after which, in accordance with FIG. 5f, the next step is effected by activation, in a manner similar to that explained in FIG. 5c, of the other shear piezos of the parts 14b.

As can be seen, the movable element 12 is thus displaced in arrow direction A in accordance with FIGS. 5c and 5f.

Upon activation of the parts 14c of piezoelectric elements that in each case carry out a shear stroke at right angles to the direction of action of the piezoelectric elements of the parts 14b, the movable partial element 12 is moved in the same way at right angles with respect to the movement sequence explained above.

As can be seen from FIGS. 5a-5f and the explanation above, in this way the partial element 12 can implement "crawling" and thus as desired a distance of e.g. 1000 μm with a resolution of 0.1 nm or more with a precision in the nanometers range, e.g. 10 nm, whereby the optical element 10 to be adjusted can be moved over a relatively large distance. These values are generally sufficient for lenses in a projection objective. Distances of up to 10 mm or more with an accuracy of 1 μm are also possible for optical elements e.g. in an illumination device of a projection objective.

FIG. 4 shows an intermediate member 17, which produces the connection between the movable part 12a and the optical element, e.g. the lens 10. The intermediate member 17, instead of a direct connection to the optical element, can also be connected as well to an inner mount in which the optical element is mounted (see dashed illustration bearing the reference symbol 20).

As can be seen from FIG. 4, the intermediate member 17 is embodied as an elastic rod in order to achieve a decoupling of deformations for the optical element.

Instead of an elastic rod or else as additional deformation decoupling, the intermediate member 17 can be connected either to the partial element 12a or to the optical element 10 via an articulation part 18. The articulation part 18 can be embodied as a solid articulation.

Figure 6:
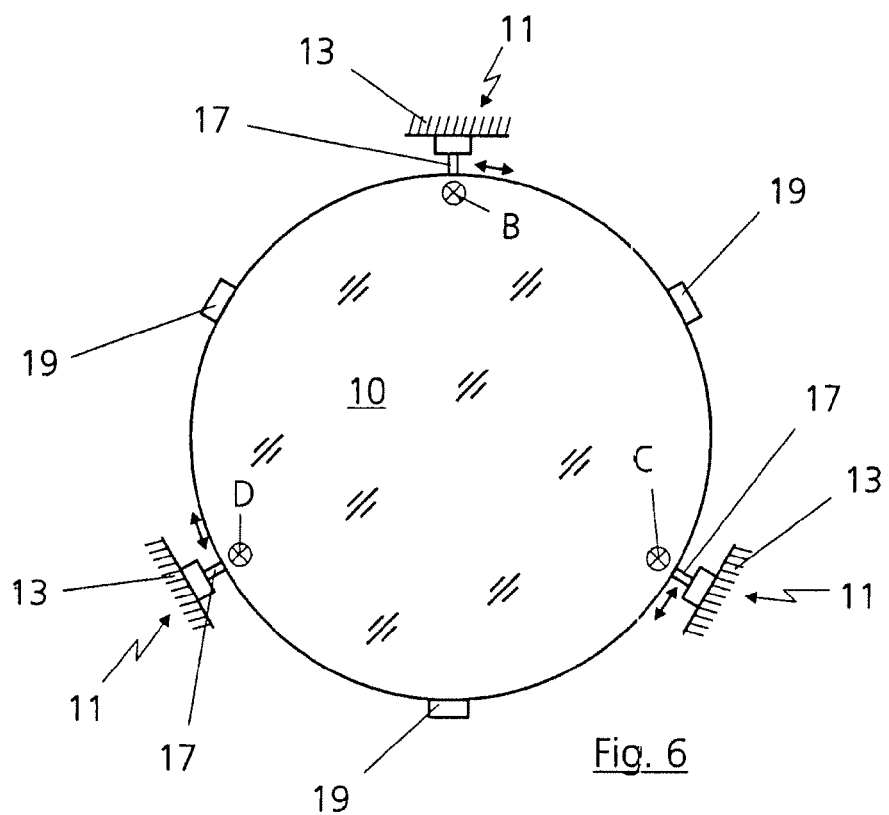
FIG. 6 shows a plan view of a lens with three linear drives.

FIG. 6 shows, in a plan view of a lens 10 as optical element, three drive devices 11 arranged uniformly over the circumference of the lens and including in each case a plurality of stacks 15 having piezoelectric elements 14. As can be seen, in this case the three intermediate members 17 in accordance with FIG. 4 act radially on the lens 10. Upon respective activation of the third parts 14c of piezoelectric elements in the stacks 15, this gives rise to a tangential direction of action and hence a rotation of the lens 10 (also see FIG. 4). Upon activation of the second parts 14b, this gives rise to a displacement in accordance with B, C or D parallel to the optical axis, to be precise in a manner dependent on the parts 14b respectively activated in the three drive devices 11. In this way, the lens 10 can be displaced in a polar coordinate system in a plane at right angles with respect to the Z-axis and thus with respect to the optical axis. It goes without saying that a displacement in an orthogonal coordinate system, namely an X-/Y-coordinate system, is also possible by mathematical transformation of the polar coordinate system with a corresponding open-loop and closed-loop control.

In this configuration, a displacement parallel to the Z-axis is thus achieved by the parts 14b of the piezoelectric elements 14 (also see FIG. 4).

If the three drive devices 11 are activated to different intensities or partly in opposing fashion, then in addition to the three translational degrees of freedom for a movement of the lens 10 three rotational degrees of freedom and thus a total of six degrees of freedom are possible. Thus, in this way for example rotations or tiltings both about the Z-axis and about the X-/Y-axes are possible.

As can furthermore be seen from FIG. 6, one or more sensors 19 can also be provided at the optical element, the sensors detecting the position of the lens 10 and the movement sequence upon activation of one or more of the linear drives 11. Exact open-loop control or else closed-loop control of the movement of the lens is possible in this way.

The sensors 19 need not be provided at the lens 10, but rather can also be provided at any other locations, such as e.g. the movable partial elements 12 or the intermediate members 17, in order to detect the position and the movement of the lens. A further possibility consists in detecting the position and the movement of the optical element that is measured in the image itself. This means that the imaging or wavefront is monitored for image aberrations downstream of the projection objective.

The lens mounting illustrated in FIG. 6 with the possibility of adjustment of the lens corresponds practically to a bipodal or hexapodal mounting.

As mentioned above, the optical element can be moved both in analog fashion and in step-by-step fashion. Fewer stacks 15 having piezoelectric elements 14 are necessary in the case of analog operation. What is disadvantageous in this case, however, is that only a movement within a predetermined range is possible, in which case the piezoelectric elements always have to be activated in order to comply with a preselected position or position to be selected. One advantage of this configuration, however, is that very exact displacements and positionings become possible in this way.

The advantage of a step-by-step displacement with a corresponding higher number of stacks 15 having piezoelectric elements 14 is that the possibilities of movement for the optical element to be manipulated are significantly greater and that the piezoelectric elements can be at least partly deactivated after the end of the movement.

Figure 7:
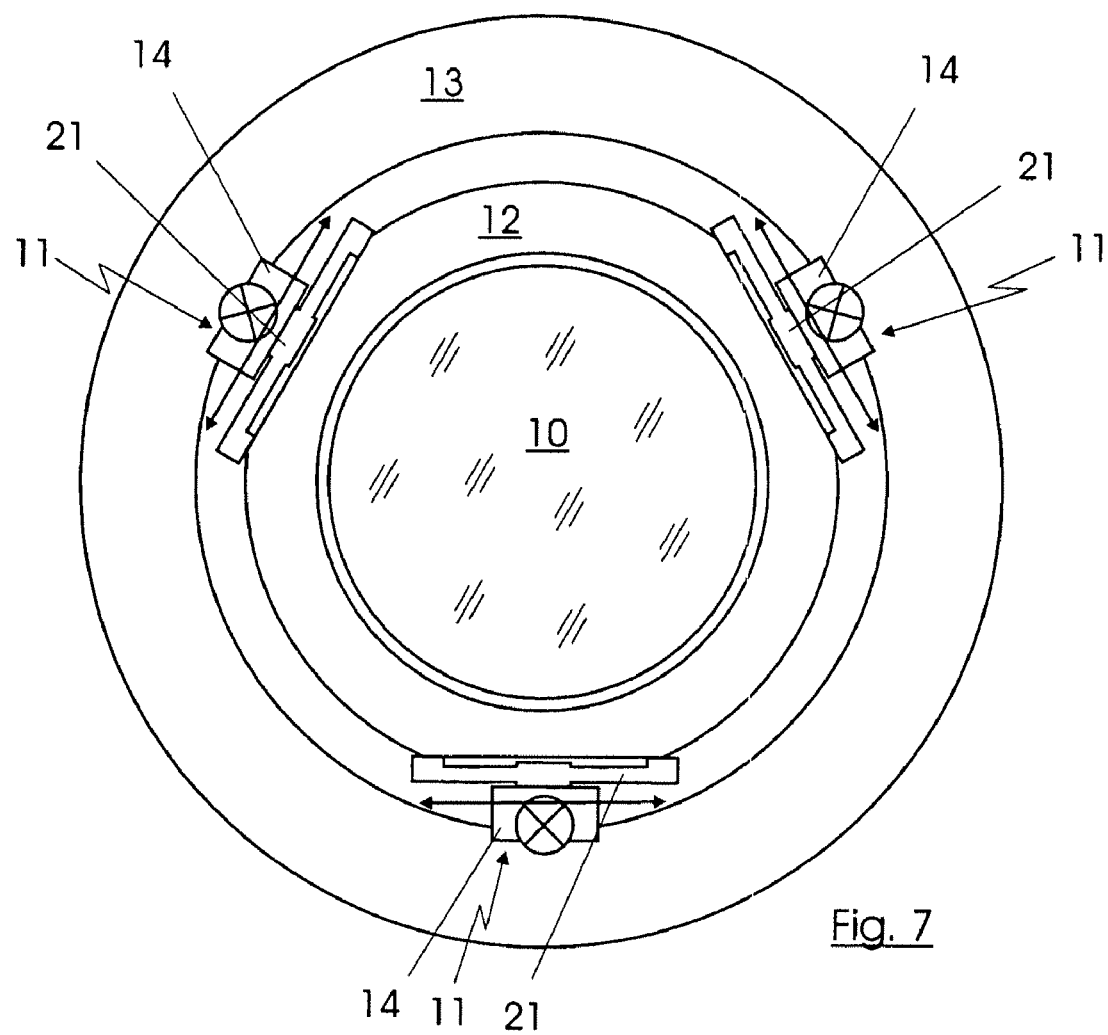
FIG. 7 shows a plan view of a lens mounted in an outer mount with a decoupling example and a possibility of adjustment in six degrees of freedom.
Figure 8:
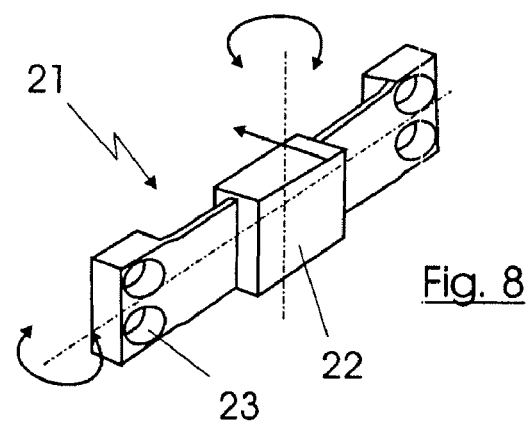
FIG. 8 shows a fixing example for a drive device.

FIG. 7 shows an embodiment similar to the embodiment according to FIG. 6 with a decoupling example of the lens 10 with an inner ring 12 as mount as movable partial element and outer mount 13 as stationary partial element.

As can be seen, three drive devices 11 are arranged in a manner distributed uniformly on the circumference between the inner ring 12 and the outer mount 13, which are in each case provided with a stack having piezoelectric elements 14. Each stack here can have a configuration as illustrated in FIG. 3. Displacements of the inner ring 12 with the lens 10 in an axial and in a tangential direction as well as tiltings and rotations can then be carried out with each stack of piezoelectric elements 14. This means that manipulations in a total of six degrees of freedom are possible. In this case, the axial direction represents the optical axis.

On the outer circumference, the piezo-stacks 14 are in each case fixedly connected to the inner circumference of the outer mount 13. The linking of the piezo-stacks 14 to the inner circumference is effected with the inner ring 12 in each case via leaf springs 21 for decoupling. The leaf springs 21 are configured such that they are soft in a radial direction and stiff in an axial and a tangential direction. They are likewise soft in the axial and tangential moment directions. The piezo-stacks 14 are in each case fixed in the central region of the leaf spring 21 (in a manner not illustrated more specifically). The connection of the leaf spring 21 to the inner ring 12 is effected in each case at the ends of the leaf spring e.g. via holes 23 with a screw connection.

If all three drive devices 11 are moved in the same sense perpendicular to the optical axis tangentially, this gives rise to a tangential movement of the lens 10. If only two drive devices 11 are moved in a tangential direction, then this results in a displacement in the X- or Y-direction since, on account of the elastic or soft mounting of the third drive device 11 via the leaf springs 21, this can flex, whereby the lens can correspondingly be displaced in a plane perpendicular to the optical axis. Upon activation of the three drive devices in the second direction of movement of the stacks 15 including the piezoelectric elements 14, the optical element 10 is displaced in the direction of the optical axis.

If the three drive devices 11 are activated to different intensities and/or in different directions of movement, tiltings are also possible.

By virtue of the arrangement of the three drive devices 11 uniformly on the circumference of the lens with a 120° separation in each case, movements of the optical element in a total of six degrees of freedom (3 linear and 3 rotational) are thus possible, even though each drive device 11 with the stacks 15 alone is movable in each case only in two degrees of freedom.

Figure 9:
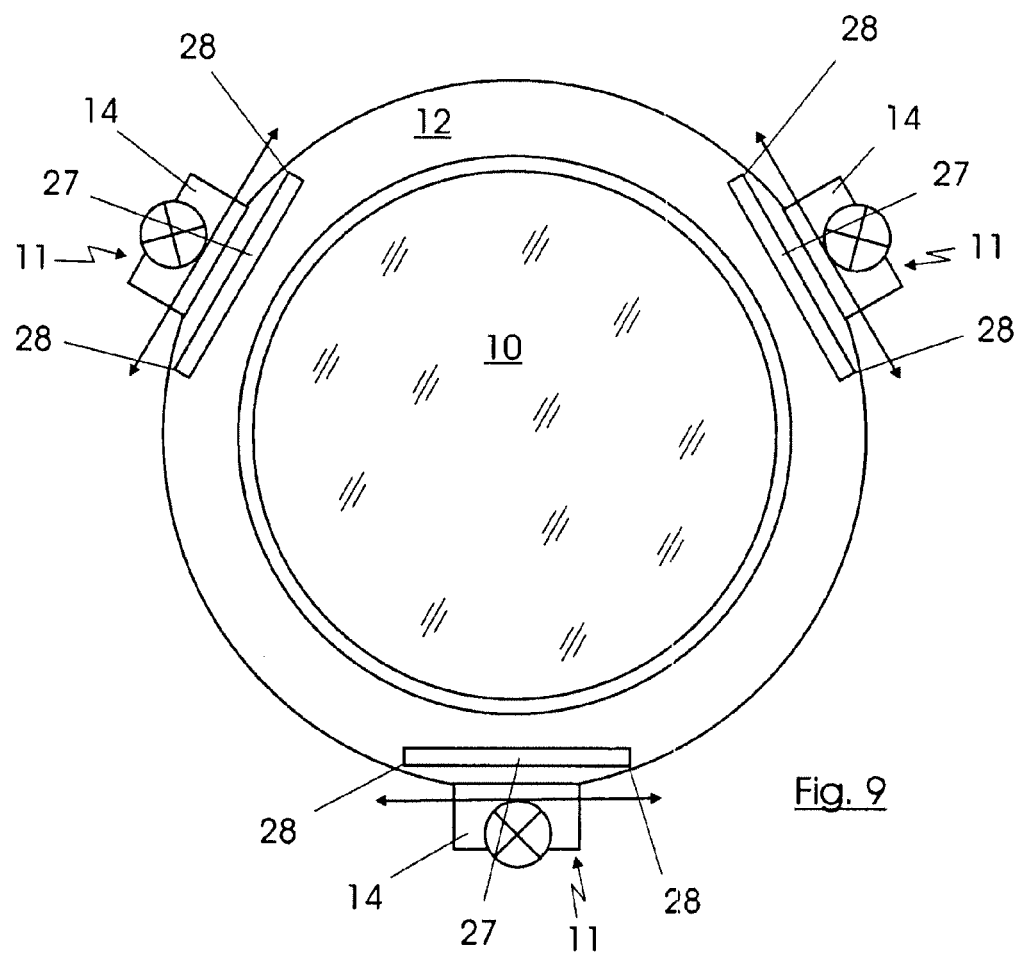
FIG. 9 shows a plan view of a lens with a mount with monolithic decoupling.

FIG. 9 shows a configuration similar to the exemplary embodiment according to FIG. 7, in which case the outer mount 13 has been omitted for simplification.

Instead of a decoupling of the inner ring 12 with the lens 10 via leaf springs 21, in this case a monolithic decoupling is provided such that longitudinal slots 27 running continuously in the axial direction are fitted in the inner ring 12 in each case in the region of the linking of the drive devices with the piezoelectric elements 14. In this case, the length of the longitudinal slots 27 is chosen such that the piezoelectric elements 14 are linked to the inner ring 12 in each case only via very thin-walled wall parts 28 situated in each case at the ends of the longitudinal slots 27 between the latter and the outer circumferential wall of the inner ring 12. In this way, the same effect as with the leaf springs 21 is achieved upon activation of the three drive devices 11.

Figure 10:
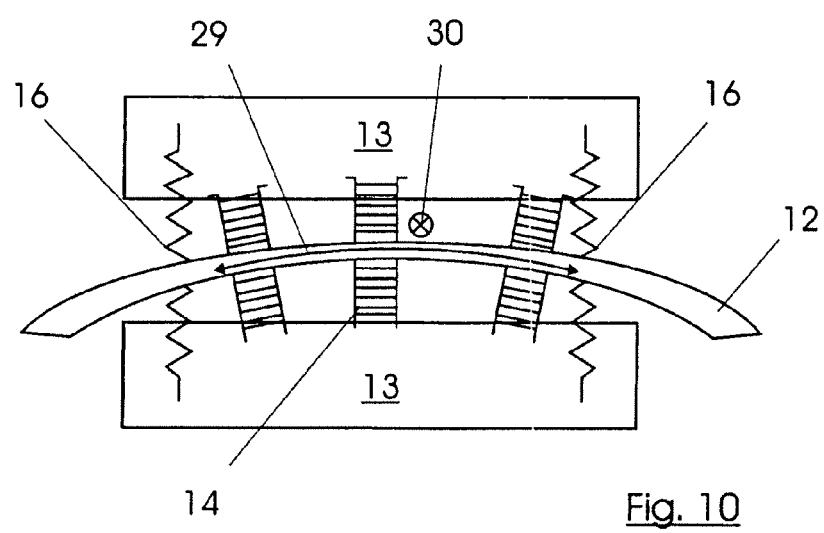
FIG. 10 shows a basic illustration of a linear drive with piezoelectric elements, similar to the illustration according to FIG. 2 for large rotational movements.

FIG. 10 shows a possibility of use similar in nature to that described in FIG. 2. In contrast to the configuration according to FIG. 2, however, in this case the movable partial element 12 is embodied in the form of a rotor in curved fashion rather than in linear fashion and is thus suitable in accordance with its curvature for very large rotational movements, e.g. >1.5°. The rotor 12 as movable element in this case is once again situated between two stationary partial elements 13, which, in the case of a projection objective 7, for example, can be the housing thereof. The same applies to a use in an illumination device 3.

Via the stacks 15 having the piezoelectric elements 14, upon activation thereof, rotational movements in arrow direction 29 in the form of a tangential circumferential movement and axial movements in accordance with arrow 30 (out of or into the plane of the drawing) can correspondingly take place. In the case of a corresponding incorporation in a projection objective 7, axial movements mean movements in the direction of the optical axis.

Figure 11:
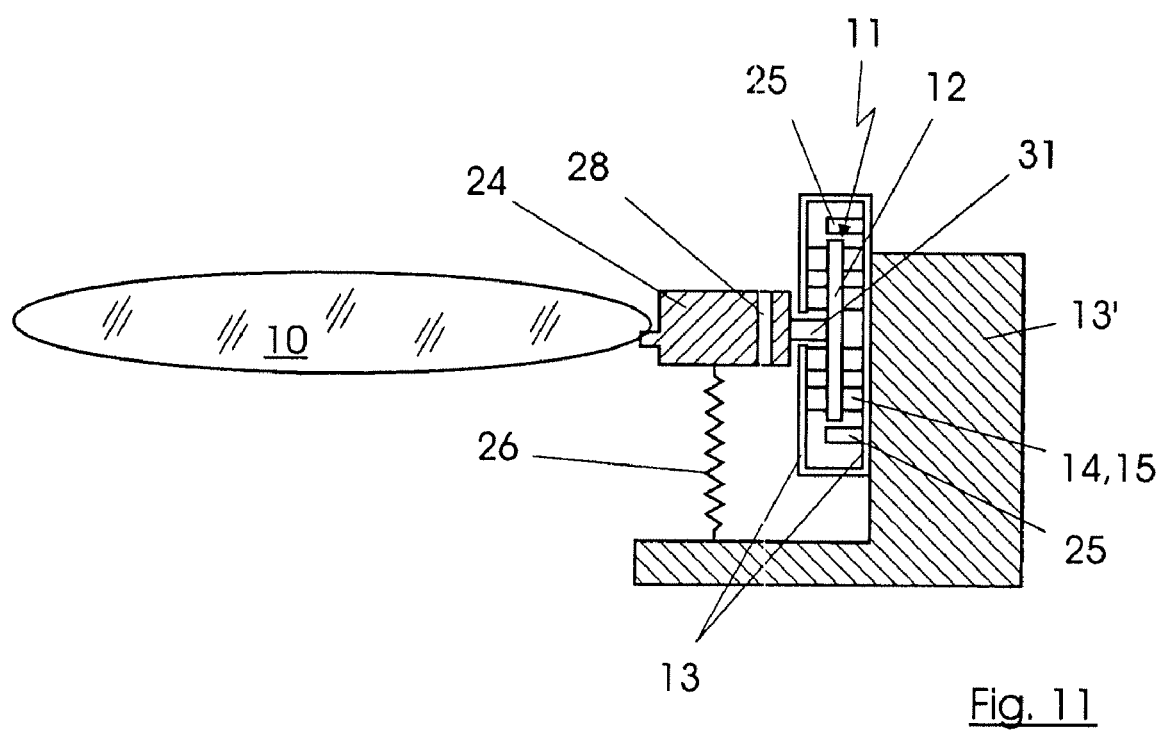
FIG. 11 shows a side view of a mounting for a lens in a mount with weight force compensation.

FIG. 11 illustrates a mounting of a lens 10 in a mount 24 in side view (partly in section). The mount 24 as inner ring is connected to an outer mount or a part of the objective housing as stationary partial element 13' via a drive device 11. The drive device 11 can be constructed in the same way as the drive device illustrated in FIG. 2 with a movable partial element 12 as rotor. The partial element 12 lies between a plurality of stacks 15 arranged at a distance from one another and each having a plurality of piezoelectric elements 14 or 14a, 14b and 14c which effect corresponding forces on the movable partial element 12 for the displacement thereof in a plurality of degrees of freedom. The stacks 15 having the piezoelectric elements 14 are in turn in each case supported on stationary partial elements 13 which are in turn fixedly connected to the housing part 13', e.g. a housing wall of the projection objective 7.

As in the exemplary embodiment according to FIG. 9, the three drive devices 11 are arranged in a manner distributed uniformly over the circumference of the mount 24. In this case, too, a connection to the mount 24 can be effected via a decoupling in the form of leaf springs, as in the exemplary embodiment according to FIG. 7, or longitudinal slots 28, as in the exemplary embodiment according to FIG. 9.

The connection of the rotors 12 in each case as movable parts of the three drive devices 11 to the inner ring 24 is effected in each case via a radially extending connecting member 31, which is led through a cutout in the wall of the stationary housing part 13 with play in such a way that movements of the inner ring 24 and thus of the lens 10 become possible. In this case, in terms of their effect, the connecting members 31 correspond to the intermediate members 17 in FIG. 4.

An end stop 25 can in each case be provided above and below the rotor as movable part 12, the end stop being fixed to the stationary housing part 13. The upper and lower stops 25 at the same time also constitute protection against "falling out", e.g. during transport.

Via the three drive devices 11 arranged in a manner distributed over the circumference as direct drives, movements of the inner ring 24 and thus of the lens 10 in 6 degrees of freedom are possible in the case of a construction of the piezo-stacks in accordance with FIG. 3.

For gravitational force compensation, one or more spring devices 26 arranged in a manner distributed over the circumference can be arranged between the stationary housing part 13' and the inner ring 24, the spring devices counteracting with adjustable force, if appropriate, the gravitational force from the weight of the inner ring 24 and lens 10. By virtue of this configuration, the drive devices 11 with the piezoelectric elements 14 do not have to apply any weight force during the adjustment of the lens 10.

Instead of a spring device 26 it is also possible, of course, to provide a Lorenz actuator, a pneumatic system or similar devices for compensation of the weight force.

What is claimed is:

1. An apparatus, comprising:
   an illumination device;
   a projection objective;
   an optical element; and
   a manipulator, comprising:
      a first drive device for the optical element, the first drive device, comprising:
         a movable element;
         a stationary element movable relative to the movable element; and
         piezoelectric elements between the movable element and the stationary element, the piezoelectric elements comprising a first set of piezoelectric elements, a second set of piezoelectric elements, and a third set of piezoelectric elements,
   wherein the optical element is in the illumination device or the projection objective, and the apparatus is a projection exposure apparatus, and
   wherein during use of the manipulator:
      the first set of piezoelectric elements has a direction of action which is at least approximately perpendicular to a direction of movement of the movable element;
      the second set of piezoelectric elements has a direction of action in the direction of movement of the movable element;
      the third set of piezoelectric elements configured to have a direction of action which is at least approximately perpendicular to the direction of action of the first set of piezoelectric elements; and
      the direction of action of the third set of piezoelectric elements has an angle with respect to the direction of action of the second set of piezoelectric elements.

2. The projection exposure apparatus as claimed in claim 1, further comprising:
   a second manipulator comprising a second drive device; and
   a third manipulator comprising a third drive device,
   wherein, during use of the manipulator, the first, second and third drive devices act on a circumference of the optical element or a mount of the optical element so that the optical element is moveable in up to six degrees of freedom.

3. The projection exposure apparatus as claimed in claim 2, wherein each of the first, second and third drive devices comprises piezoelectric elements.

4. The projection exposure apparatus as claimed in claim 3, further comprising decoupling elements that connect the three drive devices to the mount of the optical element.

5. The projection exposure apparatus as claimed in claim 4, wherein the decoupling elements are leaf springs.

6. The projection exposure apparatus as claimed in claim 4, wherein the decoupling elements have longitudinal slots introduced into the mount in the region of the drive devices, and wherein the drive devices are connected to the mount via thin-walled wall elements between the longitudinal slots and an outer circumference of the mount.

7. The projection exposure apparatus as claimed in claim 2, wherein the three drive devices are configured to act as direct drives on the circumference of the optical element.

8. The projection exposure apparatus as claimed in claim 2, wherein each of the second and third drive devices comprises:
   a first set of piezoelectric elements which, during use of the manipulator, has a direction of action at least approximately perpendicular to the direction of movement of the movable element; and
   a second set of piezoelectric elements which, during use of the manipulator, has a direction of action in the direction of movement of the movable element.

9. The projection exposure apparatus as claimed in claim 8, wherein:
   each of the second and third drive devices further comprises a third set of piezoelectric elements;
   for each of the second and third drive devices, during use of the manipulator:
      the third set of piezoelectric elements has a direction of action at least approximately perpendicular to the direction of action of the first set of piezoelectric elements; and
      the direction of action of the third set of piezoelectric elements has an angle with respect to the direction of action of the second set of piezoelectric elements.

10. The projection exposure apparatus as claimed in claim 9, wherein the angle is approximately a right angle.

11. The projection exposure apparatus as claimed in claim 8, wherein the projection exposure apparatus comprises at least three stacks of piezoelectric elements arranged a distance from one another.

12. The projection exposure apparatus as claimed in claim 8, wherein each set of piezoelectric elements comprises three sets of piezoelectric elements which can be activated in different directions of movement.

13. The projection exposure apparatus as claimed in claim 8, wherein in each stack piezoelectric elements is provided for one direction of movement or two directions of movement.

14. The projection exposure apparatus as claimed in claim 1, wherein the movable element is a curved rotor, and piezoelectric elements are arranged on both sides of the curved rotor.

15. The projection exposure apparatus as claimed in claim 1, further comprising a weight force compensation device between the stationary element and an element selected from the group consisting of the optical element and a mount of the optical element.

16. The projection exposure apparatus as claimed in claim 15, wherein the weight force compensation device comprises a spring device, a Lorenz actuator or a pneumatic device.

17. The projection exposure apparatus as claimed in claim 1, wherein the movable element is arranged at a location selected from the group consisting of the optical element, a mount to which the optical element is connected, a part connected to the optical element, and a part connected to the mount.

18. The projection exposure apparatus as claimed in claim 1, wherein the movable element is prestressed with respect to the stationary element.

19. The projection exposure apparatus as claimed in claim 18, further comprising a spring device to provide the prestress.

20. The projection exposure apparatus as claimed in claim 1, further comprising a sensor configured to determine a position of the movable element.

21. The projection exposure apparatus as claimed in claim 20, wherein the sensor is provided at the optical element, the sensor is provided at a mount for the optical element, or the sensor is provided at a part connected to the mount for the optical element.

22. The projection exposure apparatus as claimed in claim 1, wherein the angle is approximately a right angle.

23. The apparatus of claim 1, the optical element is in the projection objective, and the drive device is configured so that the optical element is moveable up to 1000 μm with an accuracy of 10 nm in at least two degrees of freedom.

24. The apparatus of claim 1, wherein the optical element is in the illumination device, and the drive device is configured so that the optical element is moveable up to 10 mm with an accuracy of 1 μm in at least two degrees of freedom.

25. The projection exposure apparatus of claim 1, wherein the first, second and third sets of piezoelectric elements define a stack.

26. The projection exposure apparatus of claim 25, wherein the stack is between the movable element and the stationary element.

27. The projection exposure apparatus of claim 1, wherein each of the first, second and third sets of piezoelectric elements is between the movable element and the stationary element.

28. A method, comprising:
using a group of piezoelectric elements of a drive device of a manipulator to position and adjust an optical element in a projection exposure apparatus for microlithography, the group of piezoelectric elements comprising first, second and third sets of piezoelectric elements,
wherein:
the group of piezoelectric elements acts on a movable element of the drive device;
the first set of piezoelectric elements acts on the movable element with a direction of action at least approximately perpendicular to a direction of movement of the moveable element;
the second set of piezoelectric elements acts on the movable element with a direction of action in the direction of movement of the movable element;
the third set of piezoelectric elements acts on the movable element with a direction of action that is at least approximately perpendicular to the direction of action of the first set of piezoelectric elements; and
the direction of action of the third set of piezoelectric elements is at an angle with respect to the direction of action of the second set of piezoelectric elements.

29. The method as claimed in claim 28, wherein the angle is at least approximately a right angle.

30. The method as claimed in claim 28, wherein a movement of the optical element is performed by at least three stacks of piezoelectric elements which are arranged at a distance from one another.

31. The method as claimed in claim 28, wherein three drive devices are arranged in a manner distributed over a circumference of the optical element, thereby allowing six degrees of freedom for the adjustment, positioning and tilting of the optical element depending on activation of the piezoelectric elements.

32. The method of claim 28, wherein the method comprises moving the optical element in up to six degrees of freedom.

33. The method of claim 28, wherein the optical element is in the projection objective, and the method comprises moving the optical element up to 1000 μm with an accuracy of 10 nm in at least two degrees of freedom.

34. The method of claim 28, wherein the optical element is in the illumination device, and the method comprises moving the optical element up to 10 mm with an accuracy of 1 μm in at least two degrees of freedom.

35. The method of claim 28, wherein the first, second and third sets of piezoelectric elements define a stack.

36. The method of claim 35, wherein the stack is between the movable element and the stationary element.

37. The method of claim 28, wherein each of the first, second and third sets of piezoelectric elements is between the movable element and the stationary element.

38. An apparatus, comprising:
an illumination device;
a projection objective;
an optical element; and
a manipulator, comprising:
a drive device for the optical element, the drive device, comprising:
a movable element; and
a stationary element movable relative to the movable element,
wherein:
the optical element is in the illumination device or the projection objective;
the drive device is configured so that the optical element is movable up to 1000 μm with an accuracy of 10 nm in at least two degrees of freedom if the optical element is in the projection objective;
the drive device is configured so that the optical element is movable up to 10 mm with an accuracy of 1 μm in at least two degrees of freedom if the optical element is in the illumination device; and
wherein:
the apparatus is a projection exposure apparatus; and
the movable element is a curved rotor, and piezoelectric elements are arranged on both sides of the curved rotor.

* * * * *

UNITED STATES PATENT AND TRADEMARK OFFICE
CERTIFICATE OF CORRECTION

PATENT NO. : 8,269,948 B2  
APPLICATION NO. : 12/390685  
DATED : September 18, 2012  
INVENTOR(S) : Sascha Bleidistel Page 1 of 1

It is certified that error appears in the above-identified patent and that said Letters Patent is hereby corrected as shown below:

IN THE SPECIFICATIONS:

Column 4,
Line 45, delete "plane" and insert --plan--

Signed and Sealed this
Twenty-seventh Day of November, 2012

David J. Kappos
*Director of the United States Patent and Trademark Office*